United States Patent [19]

Kiss

[11] Patent Number: 4,576,830
[45] Date of Patent: Mar. 18, 1986

[54] DEPOSITION OF MATERIALS

[75] Inventor: Zoltan Kiss, Belle Mead, N.J.

[73] Assignee: Chronar Corp., Princeton, N.J.

[21] Appl. No.: 668,132

[22] Filed: Nov. 5, 1984

[51] Int. Cl.⁴ ............................................. B05D 3/06
[52] U.S. Cl. ................................. 427/39; 118/719;
  118/723; 118/728; 118/729; 427/86; 427/255.5
[58] Field of Search ................. 118/50.1, 719, 723,
  118/724, 728, 729; 427/39, 86, 251, 255.5

[56] References Cited

U.S. PATENT DOCUMENTS

| | | | |
|---|---|---|---|
| 2,930,347 | 3/1960 | Bulloff | 427/251 |
| 3,787,312 | 1/1974 | Wagner et al. | 118/729 |
| 4,047,624 | 9/1977 | Dorenbos | 118/719 |
| 4,089,735 | 5/1978 | Sussmann | 118/729 |
| 4,274,936 | 6/1981 | Love | 118/729 |

Primary Examiner—John H. Newsome
Attorney, Agent, or Firm—George E. Kersey

[57] ABSTRACT

In a method and apparatus for continuous plasma CVD deposition in and through a vacuum system, box carriers are provided to carry both the substrates and the plasma exciting electrodes through the system. Contamination of the system and cross doping of the applied coatings are reduced.

20 Claims, 9 Drawing Figures

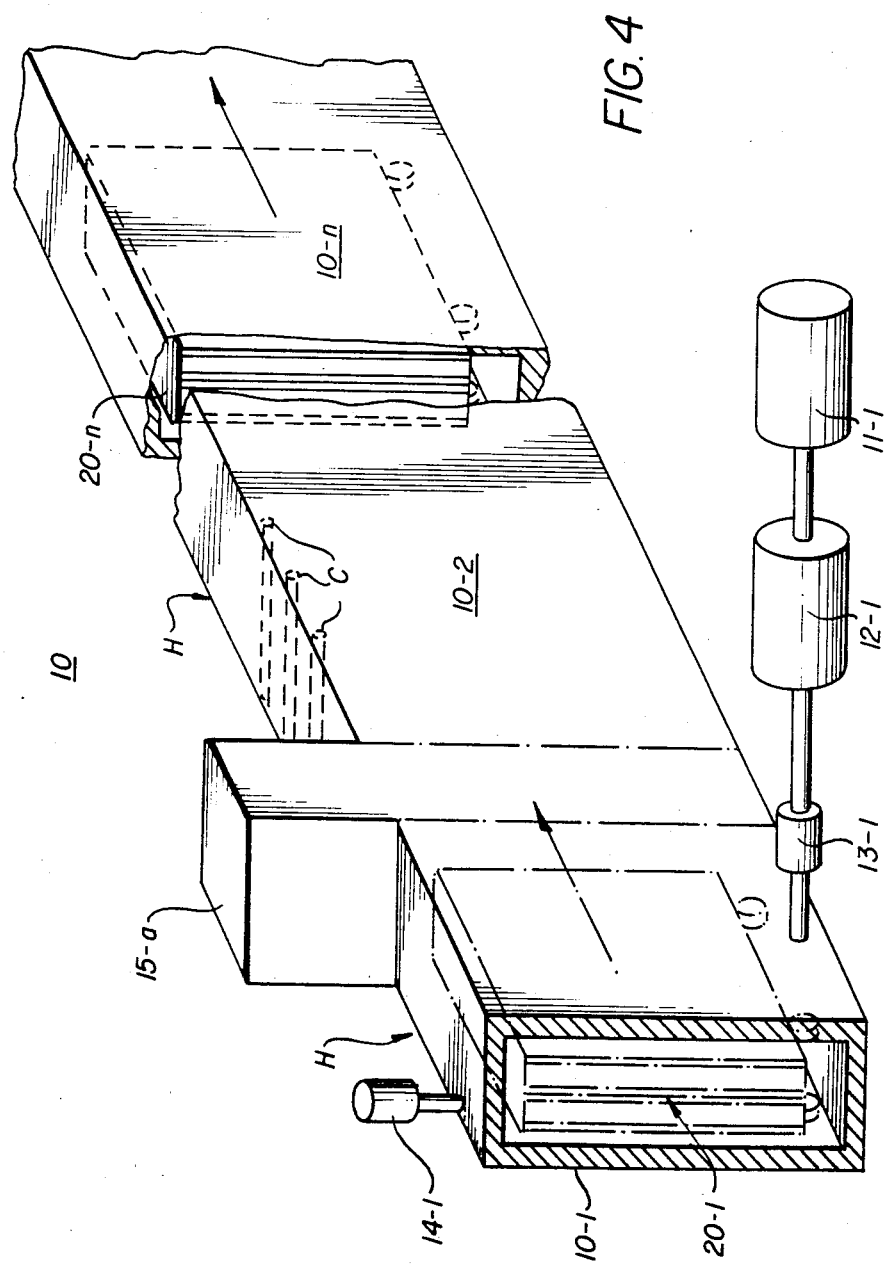

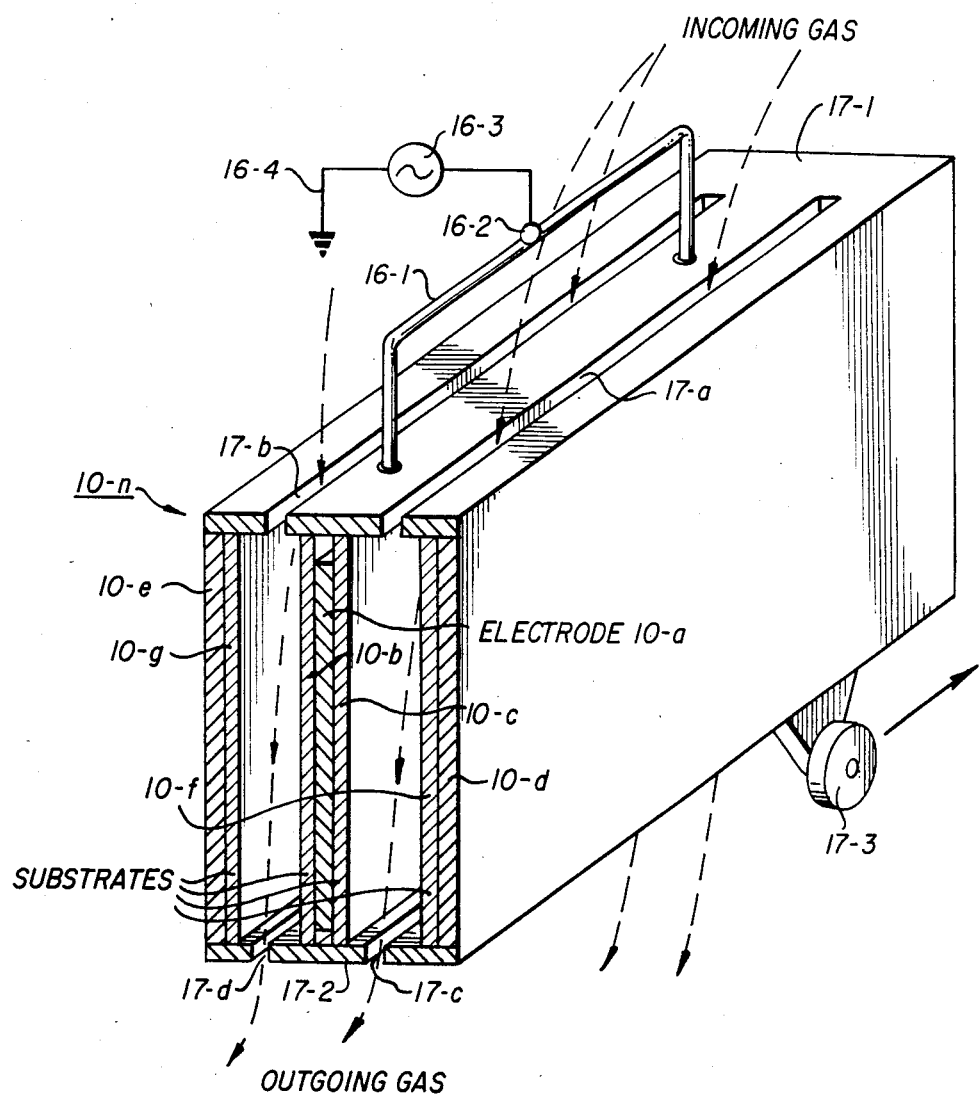

DEPOSITION OF MATERIALS

BACKGROUND OF THE INVENTION

This invention relates to the deposition of materials, and, more particularly to the deposition of semiconductor layers for solar cells.

In the manufacture of multiple layered devices, the successive layers are stacked upon one another with each layer contributing a particular characteristic to the overall structure.

In the case of a typical solar cell, the structure is a layered laminate with an intermediate layer of intrinsic material sandwiched between respective outer layers of "n" type and "p" type material.

Each layer can be deposited from a suitable gaseous mixture in a reaction chamber. The reaction can take place in a variety of ways. For example, amorphous silicon can be formed from a gaseous mixture of lower and higher order silanes with diluents and additives, e.g. "dopants" that are selected in accordance with the characteristics desired in the layer that is to be produced.

In any case, it is necessary to form the layers in sequence. Thus the reaction chamber can be first used to produce an outer layer of the solar cell, i.e. either an "n" or "p" layer. The chamber is then evacuated and used to produce an intrinsic or "i" layer upon the previously formed "n" or "p" layer.

Unfortunately in the usual case, a certain amount of undesired doping of the i-layer takes place as a result of cross contamination. In particular, in the case of amorphous silicon solar cells, when diborane is used as a dopant gas in the formation of a p-layer, the diborane cannot be totally removed from the vacuum system and a substantial amount of boron is incorporated into the i-layer. The result is a surface concentration of boron that can extend into the i-layer for several hundred Angstroms. There is also an undesirable residual doping effect throughout the i-layer. The consequence is to reduce the response of the solar cell to certain portions of the excitation spectrum. Thus, the blue response of the cell can be significantly impaired with a resultant reduction in the efficiency of the cell in converting light energy to electricity.

In general the long term operation of the chamber leads to a build-up of deposits of semiconductor film, possibly including powder, that are undesirable. These deposits may increase the cross-contamination, and produce objectionable flaking that can cause pinholes in the deposited film.

Although the contamination can be reduced by extensive pumping and flushing, or by counterdoping, these procedures are costly, time consuming and not always reliable. In addition, counterdoping can have an adverse effect on the quality of the various layers in the resulting solar cell.

To eliminate the undesired deposits, it is necessary to subject the chamber to periodic cleaning. In the case of some chamber geometries, the cleaning operation becomes very difficult.

In addition the typical chamber is provided with only one substrate surface, either a cathode or anode, on which high quality device grade amorphous silicon can be deposited Such a system is asymmetric by virtue of the large difference in surface area between the cathode and the anode. The asymmetry makes it virtually impossible to realize device grade deposits simultaneously on both surfaces. Another common drawback of such deposition systems is the fact that the deposit is usually non-uniform in thickness across the substrate and is often substantially different in thickness at the periphery of the substrate. Such thickness variations are highly undesirable.

Accordingly, it is an object of the invention to facilitate the deposit of materials, particularly in successive layers. A related object is to facilitate the deposit of layers of amorphous silicon to form solar cells.

Another object of the invention is to achieve a high degree of silicon utilization and limit the cross-contamination between layers during their formation. A related object is to do so for layered structures of amorphous silicon. Another related object is to limit undesirable doping of intrinsic layers in multilayer structures, particularly for amorphous silicon solar cells.

Another related object of the invention is to curtail the extent to which a dopant gas used in the formation of a layer can affect an adjoining layer, particularly in the case of an "i" layer of amorphous solar cells. Still another related object is to overcome undesired transitional doping in layered structures particularly that which reduces the spectral response of solar cells.

Another object is to eliminate the need for cleaning the chamber. Still another object is to eliminate film nonuniformity and "pin holes" caused by the flaking of accumulated deposits.

A further object of the invention is to limit the need for pumping and flushing in order to reduce the effects of cross-contamination during the formation of layered structures.

A still further object of the invention is to avoid the need for counterdoping of layers to overcome the adverse effects caused by the inadvertent incorporation of adverse dopants.

Still another object of the invention is to realize a high throughput for a chamber of prescribed size, i.e. increase the amount of surface area that is subject to device quality deposit per unit of time. A related object is to realize device grade deposits simultaneously on both cathode and anode substrates.

Yet other aspects are to reduce outgassing from the chamber walls, to achieve a comparatively uniform temperature across all substrates, and to achieve a suitably uniform deposition of material on all substrates regarding both thickness and other properties.

Still other objects are to achieve a system which can be used for both chemical vapor deposition and glow discharge deposition; to achieve vertical deposition with a large percentage of active substrate, without cross contamination using symmetrical surfaces with heating that causes uniform deposition on electrodes.

SUMMARY OF THE INVENTION

In accomplishing the foregoing and related objects, the invention provides a method and apparatus by which one or more box carriers, each containing one or more substrates, are used to realize specified deposits of material from a prescribed gaseous mixture that is introduced into the carriers.

Each box carrier includes side walls which are separated from one another and are joined by end walls. A substrate is positioned in the carrier against at least one of the side walls, and a gaseous mixture is introduced into the carrier to produce the desired deposit of material on the substrate. The carrier is in turn positioned in an overall reaction chamber which is evacuated and externally heated in accordance with the reaction that is to take place within the carrier.

Since the reaction takes place within the carrier the need for periodic cleaning of the chamber is eliminated. In addition, the geometry of the chamber can be chosen in a fashion that promotes the desired reaction, without regard to constructional features that would otherwise be needed to facilitate cleaning.

In addition, the absence of deposits on the chamber and their confinement to the internal surfaces and substrates of the box carrier eliminates at least one source of cross contamination in the chamber and objectionable flaking. The elimination of chamber deposits also eliminates film non-uniformity and "pin holes" caused by the flaking of accumulated deposits.

Furthermore, the use of a movable box carrier in conjunction with the chamber permits an increase in the amount of surface area that is subject to the deposit of desired layers per unit of time. For that purpose the box carrier includes an internal cathode or other energizable member that is covered by one or more substrates on which the deposit is to be made. A similar substrate is positioned against the complementary electrical structure, i.e. anode, with the result that, in the case of plasma deposition and the like, the energizing electrical field is established between substrates instead of, for example, between a cathod and a substrate, or a substrate and an anode.

In accordance with one aspect of the invention, the chamber into which the box carrier is introduced can be divided into a number of zones, with a prescribed deposit taking place at each zone. In this arrangement, each box carrier, with its substrates, moves through the successive zones of the chamber. This arrangement also permits the coupling of one box carrier to another so that during movement of the box carriers through the chamber, each box carrier occupies one of the zones and is then advanced to the next succeeding zone when the coupled set of box carriers is advanced by one zone position.

In accordance with another aspect of the invention, each box carrier is elongated to accommodate one or more substrate along its length, and its width (between its elongated sides) is significantly smaller than both its length and height. The carrier includes an electrode in the region between the side walls, the side walls form an equal potential shell with respect to the electrode. The side walls are advantageously planar and parallel, and the substrate is positioned at each side wall to receive deposits from the gaseous mixture introduced into the chamber and hence into the internally contained box carrier. The electrode also desirably has opposed planar surfaces which are parallel to the side walls and is sandwiched between further substrates for receiving deposits from the gaseous mixture. In particular the electrode acts as a bisector of the carrier and the bisected carrier has separate inlets and outlets for the gaseous mixture from which the deposit is to be made. A further important feature of the invention is the provision of plasma shields within each box carrier. The purpose of the shields is to ensure a constant deposit thickness up to the edge of the deposit. Without such plasma shields there is usually an intensified discharge around the perimeter of the central electrode (cathode) leading to a thicker deposit near the edges of the substrate. In the invention the shields are grounded and spaced approximately $\frac{1}{8}$" from the perimeter of the electrode, i.e. less than one or two times the thickness of the dark space of the discharge. Under these conditions no discharge can occur between the shield and the electrode; the intense edge discharge (and enhanced edge deposition) is therefore suppressed.

In the practice of the method aspect of the invention, a plurality of mobile carrier chambers are provided, each containing at least one substrate. In the case of box carriers having quadrilateral cross sections, each chamber contains four substrates. The mobile chambers are moved to a plurality of successive positions where a prescribed gas mixture is introduced into the chambers at selected ones of the positions. At each position, a layer of prescribed characteristics is formed. Thus, where the gas mixture introduced into a chamber contains a p-type dopant, the result is the deposit of a p-layer. Conversely, where the gas mixtures contain an n-type dopant, the result is the formation of an n-layer. Where dopantes are omitted from the gas mixutre, the result is an "i" or intrinsic layer. A common type of photocell that can be fabricated in accordance with the invention is a PIN device which appears on the substrates as an intrinsic layer bounded by respective "p" and "n" layers.

In accordance with another method aspect of the invention, the deposits produced in the various zones are created electrically, pyrolytically or in other ways, including combinations. In one example the deposits are created electrically and are pyrolytically assisted by the preheating of the chambers before they reach the zones where the gas mixtures are introduced.

In accordance with still another method aspect of the invention, the chambers are isolated from one another at the various zones by either a valve interlock arrangement, a gas curtain arrangement or a combination. The gas curtain arrangement which relies in part upon the flow dynamics of the gas mixtures that are used in making the desired deposits is advantageously supplemented by the use of spring seals between successive zones. The spring seals are advantageously included with the box carriers or chambers and engage interzone baffles when the box carriers are in position in the various zones.

In accordance with yet another aspect of the invention, the gaseous mixture introduced into the chamber, and hence into each box carrier, is either accompanied by an appropriate dopant to produce either a "p" or "n" deposit, or omits any dopant in order to produce an intrinsic or "i" dopant. The gaseous mixture desirably includes at least one silane or germane and the deposit is amorphous silicon or germanium.

DESCRIPTION OF THE DRAWINGS

Other aspects of the invention will become apparent after considering several illustrative embodiments, taken in conjunction with the drawings, in which:

FIG. 4 is a partial persepctive view of a multichamber deposition system in accordance with the invention;

FIG. 6 is a perspective view, partially in section, of a box chamber or carrier in accordance with the invention for the systems of FIG. 5A and 5B;

DETAILED DESCRIPTION

Figure 1:
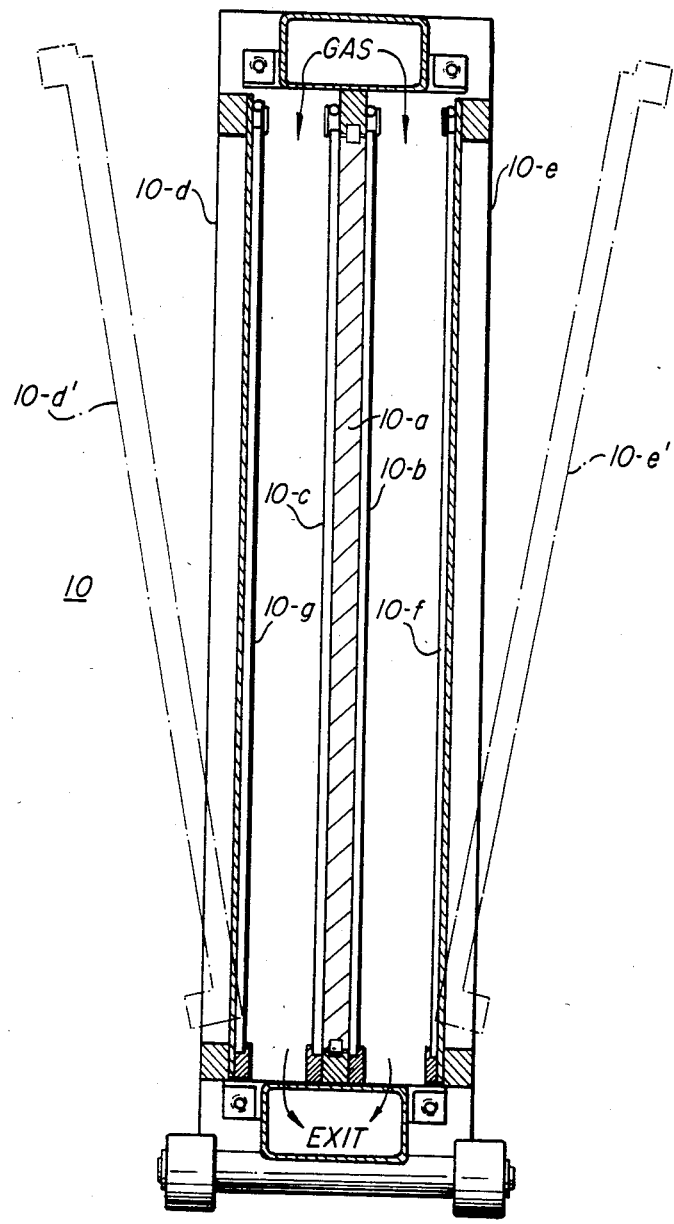
FIG. 1 is an end view of a stationary, single batch carrier in accordance with the invention.

With reference to the drawings, FIG. 1 illustrates a single carrier that can be used in batch processing according to the invention, as further described below.

The carrier 10 of FIG. 1 includes an internal centrally disposed electrode 10-$a$ which may be either an anode or cathode, that is disposed between opposite substrates 10-$b$ and 10-$c$. The side walls of the carrier 10-$n$ constitute a pair of similar electrodes 10-$d$ and 10-$e$. When the central electrode 10-$a$ is an anode, the side electrodes 10-$d$ and 10-$e$ are cathodes. Each of the side electrodes 10-$d$ and 10-$e$ is accompanied by a substrate 10-$f$ and 10-$g$. To energize the central electrode 10-$a$ standard electrical connections can be employed. It will be noted that the side panels of the carrier 10 are removable to permit access to the interior of the box which is conveniently mounted on rollers so as to be manipulated as desired and as more particularly described below.

In the particular employment of the carrier 10 of FIG. 1 a gas mixture from which the deposit of the desired substance on the substrates will be made, enters at the top and exits at the bottom of the carrier. The central electrode 10-$a$ is insulated from the remainder of the box 10 by using customary insulating materials such as teflon supports. The electrodes may be of any metallic material and the substrates upon which the deposit takes place are illustratively of glass. The individual carrier 10 of FIG. 1 may be employed in batch processing in a set of individual chambers as illustrated in FIG. 2.

Figure 2:
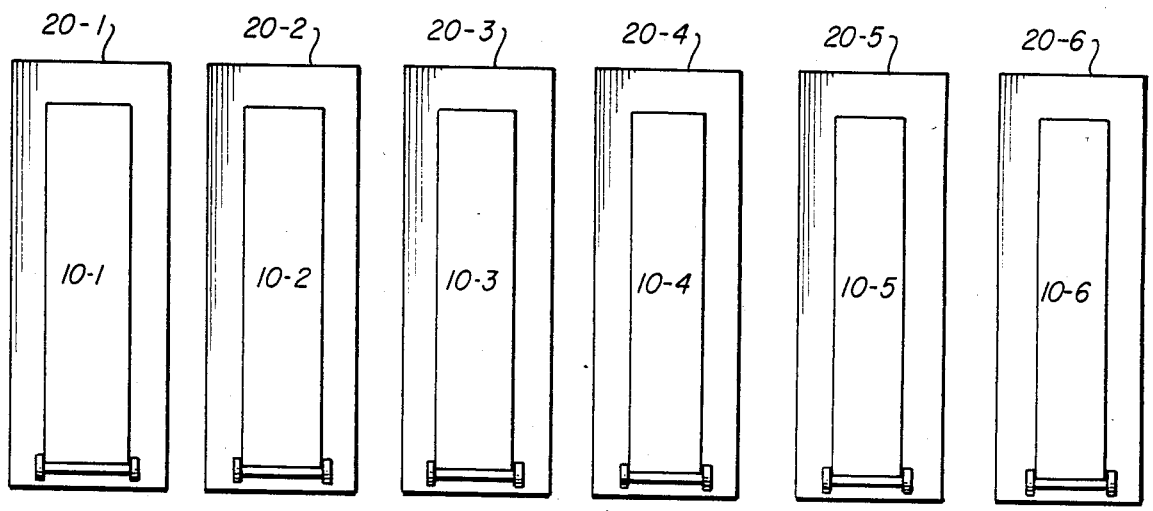
FIG. 2 is a schematic view of multiple chambers with single batch carriers in accordance with FIG. 1.

In particular, the arrangement of FIG. 2 is described as a "six pack" because six chambers are employed 20-1 through 20-6 containing respective individual carriers 10-1 through 10-6.

Figure 3:
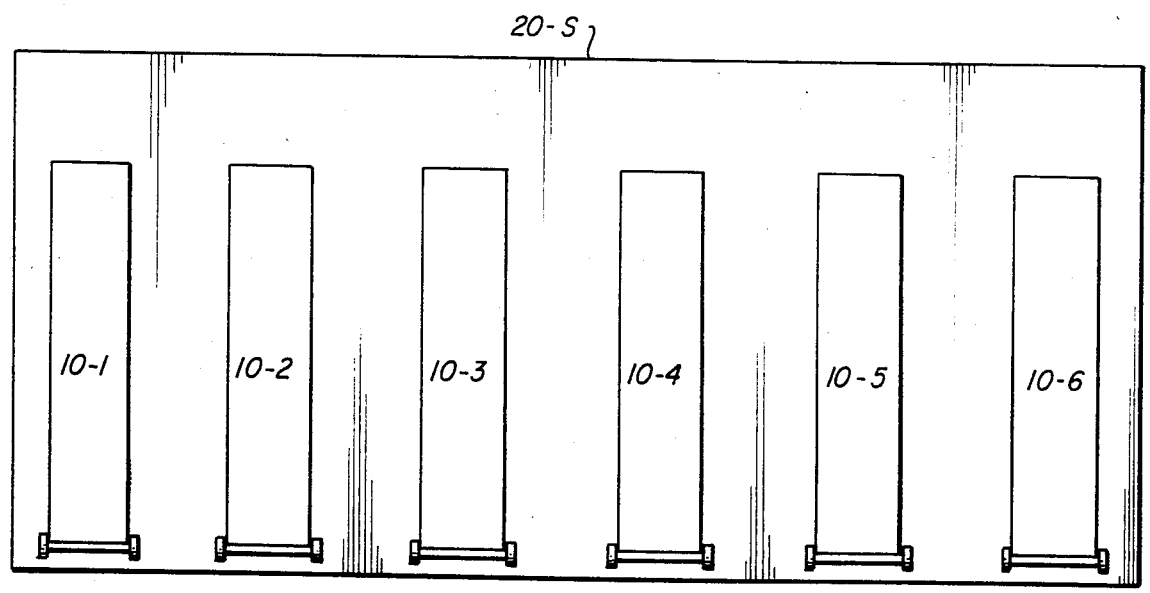
FIG. 3 is a schematic view of a single chamber for batch processing employing a plurality of carriers in accordance with FIG. 1.

Alternatively, the carrier 10 of FIG. 1 may be employed for batch processing using a single chamber 20-S illustrated in FIG. 3 where a plurality, illustratively six, individual box carriers 10-1 through 10-6 are included within the chamber.

The gaseous constituents and the electrical energization of the box carrier 10 is in accordance with the further description below.

Figure 5A:
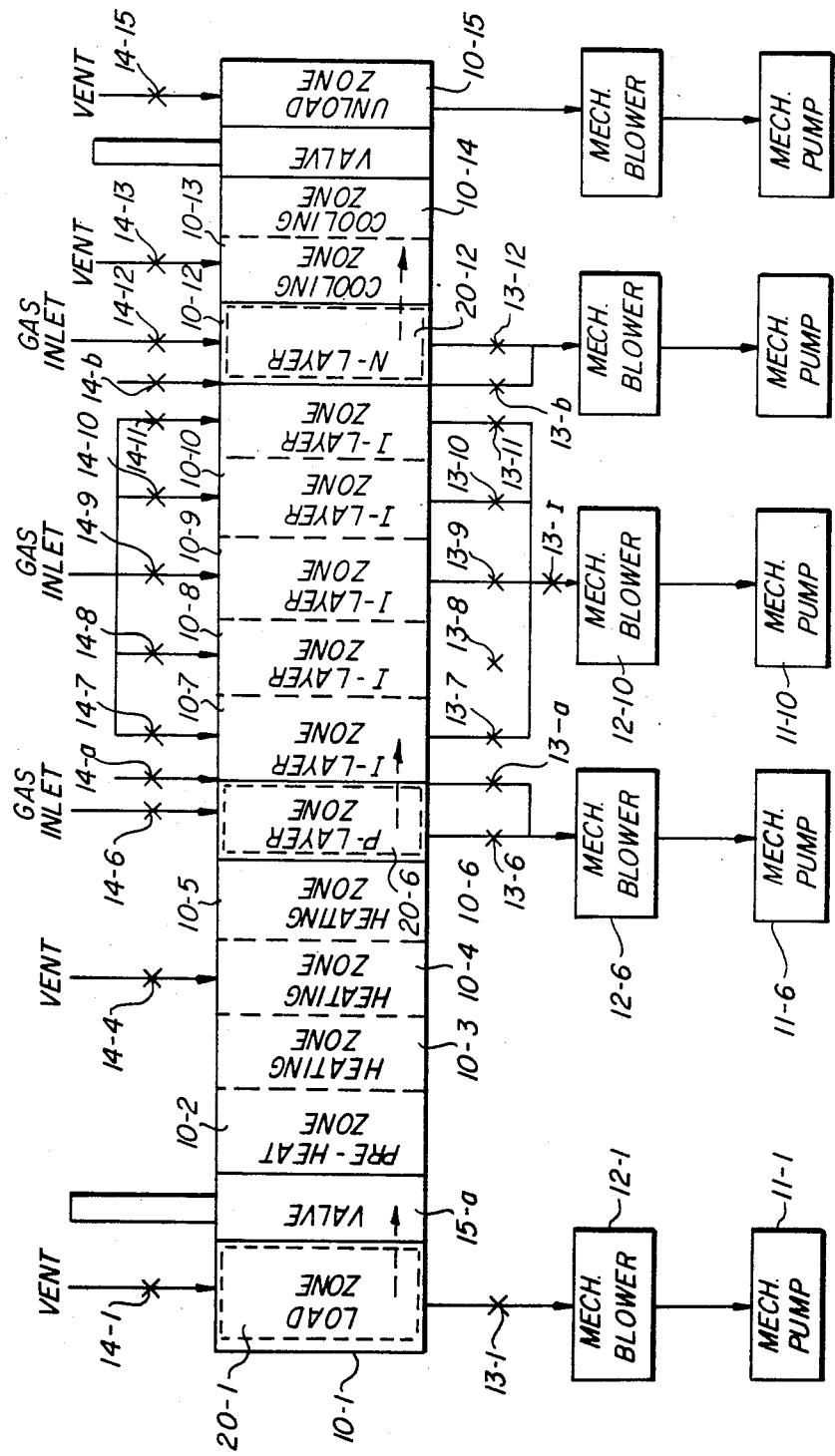
FIG. 5A is a schematic diagram of the system of FIG. 4 adapted for "gas curtain" isolation in accordance with the invention.

With reference to the drawings, FIG. 4 illustrates, in partial perspective form, and FIG. 5A shows a corresponding schematic representation of a multizone deposition system 10 which makes use of a plurality of box carriers, generally designated as 20-$n$ of the type illustrated in FIG. 6. In the system 10 an elongated housing H is provided which is divided into a plurality of distinctively different zones. For example in one embodiment of the invention, 15 distinctive zones are provided.

The first zone 10-1 of FIG. 4 is a "load" zone representing the position where a first box carrier 20-1 is prepared for incorporation into a moving box carrier system. At the load position 10-1, the carrier 20-1 is introduced into the system and brought under vacuum by a mechanical pump 11-1 which operates in conjunction with a mechanical booster 12-1. Both the pump 11-1 and the booster 12-1 act through a valve 13-1. In addition, a vent valve 14-1 is provided at the upper surface of the housing H in the region of the load zone 10-1.

Once the desired vacuum is established in the load zone 10-1, the box carrier 20-1 is moved through an interzone valve 15-$a$ to a preheat zone 10-2. At the preheat zone 10-2 heating coils C which surround the housing H, provide the desired initial heating of the box carrier.

In the case of the schematic representation of FIG. 4 the various box carriers 20-1 through 20-$n$ are shown coupled to one another and occupying various ones of the corresponding zones 10-1 through 10-$n$. It will be understood that the system 10 of FIGS. 4 and 5A is "moving", so that as the box carrier 20-1 is moved along the main axis of the housing H it occupies successively different zones. In other words, the first box carrier 20-1 that is introduced into the housing at the load position 10-1 will later move through the entire system and occupy zones 10-2, etc., until the process is completed.

It will be appreciated that the propulsion mechanism by which the interconnected set of box carriers 20-1 through 20-$n$ move through the housing H in order to provide for the proper deposit of materials, can be controlled in a variety of ways. An internal conveyor can be provided. Alternatively each box carrier can be coupled to a succeeding box carrier using the type of coupling associated with railroad boxcars. Indeed, the various box carriers 20-1 through 20-$n$ can be considered to represent a train of cars which move through the housing in the fashion of a tunnel where each position or station of the tunnel represents one of the processing zones where a particularly operating step takes place.

The schematic details for one operating technique in accordance with the invention is illustrated in FIG. 5A. Again, the first zone 10-1 is a "load" zone representing the position where the first box carrier is introduced into the system. As discussed, previously, the box carrier that is introduced into the load zone subsequently moves into the first preheat zone 10-2. Following the first stage of preheating, the box carrier moves to a second preheat zone 10-3. This is, in turn, followed by movement of the box carrier into a third preheat zone 10-4. The zone 10-4 also includes a vent 13-4 in order to eliminate any gas buildup that may have occurred within the housing H because of the heating effect in the prior zones. As indicated in FIG. 5A the final preheating zone is 10-5. In the case of FIG. 5A four preheat zones are provided in order to achieve uniform heating at the desired temperature level. If an attempt were to be made to heat the box carrier from a comparatively low initial temperature to the desired temperature at which pyrolytically assisted deposition takes place, the objective of uniform heating might not be attained.

Following preheating of the carrier, it enters the "p" layer zone 10-6 which has a gas inlet 14-6 for a gaseous mixture containing a "p" dopant. The gas mixture is drawn through the carrier 20-6 in the zone 10-6 by the action of a mechanical pump 11-6 acting in conjunction with a mechanical booster 12-6 through a valve 13-6. In addition, as explained more fully below, the mechanical pump 11-6 and the mechanical booster 12-6 act through a further valve 13-$a$ in order to provide gas curtain isolation between the "p" layer zone 10-6 and the next zone 10-7 where an intrinsic layer is to be applied. The gas curtain is provided by a gas mixture, of inert type, applied through an inlet 14-a.

Once the "p" layer has been formed in the zone 10-6, the carrier, now designated 20-7, enters the first "i" layer zone 10-7. Since the "i" layer requires considerably more deposit time than the "p" layer, deposition is performed in five steps, for example in zones 10-7 through 10-11. This has the effect of providing a significant increase in throughput for the system. In making the "i" layer deposit, the gaseous mixture from which the deposit is to be made is applied through a master gas inlet 14-I and then through the subordinate valves 14-7 through 14-11 for the individual zones. Similarly, the output is by way valves 13-7 through 13-11 and a master valve 13-I. Again, a mechanical pump 11-10 operates in connection with a mechanical booster 12-10. In the case of the pumps 11-1 and 11-6 the capacity is on the order of 60 cfm (cubic feet per minute). By contrast, in the case of the pump 11-10, the capacity is 150 cfm. Similarly, the mechanical booster 12-10 has a capacity of 900 cfm compared with 200 cfm for the similar boosters 12-1 and 12-6.

Once the transition through the "i" zone is complete, the carrier, now designated 20-12 enters the first "n" layer zone 10-12 after having passed through the gas curtain between the last of the "i" layer zones 10-11 and the "n" layer zone 10-12. The gas for the curtain is applied over an inlet 14-b and drawn through a valve 13-b by a mechanical booster 12-12. The latter operates in connection with a mechanical pump 11-12. The capacities for the booster 12-12 and the pump 11-12 are the same as for the "p" layer zone 10-6 and the booster 12-6 and the pump 11-6.

In the "n" layer zone 10-12 a gas with a suitable "n" dopant is applied through an inlet 14-12 and through an outlet 13-12. The same mechanical booster 12-12 and mechanical pump 11-12 that applied the curtain between the "i" layer zone 10-11 and the "n" layer zone is used for the dopant gas in the "n" layer zone.

The formation of the "n" layer is followed by cooling in two zones 10-13 and 10-14. The rate and nature of cooling are adjustable to provide desirable properties to the deposit made within the box carriers 20-13 and 20-14. Following cooling in the zone 10-14 the carrier moves through an output valve 15-b into an unload zone 10-15. The unload zone 10-15 is the output counterpart of the load zone 10-1.

It will be appreciated that the preheating may be supplemented by heating at any one of the "p", "i" or "n" layer zones as desired. In general the system 10 provides a technique for the pyrolytically assisted deposit of materials in conjunction with one or more other deposition techniques such as glow discharge, silent electric discharge, etc.

Figure 5B:
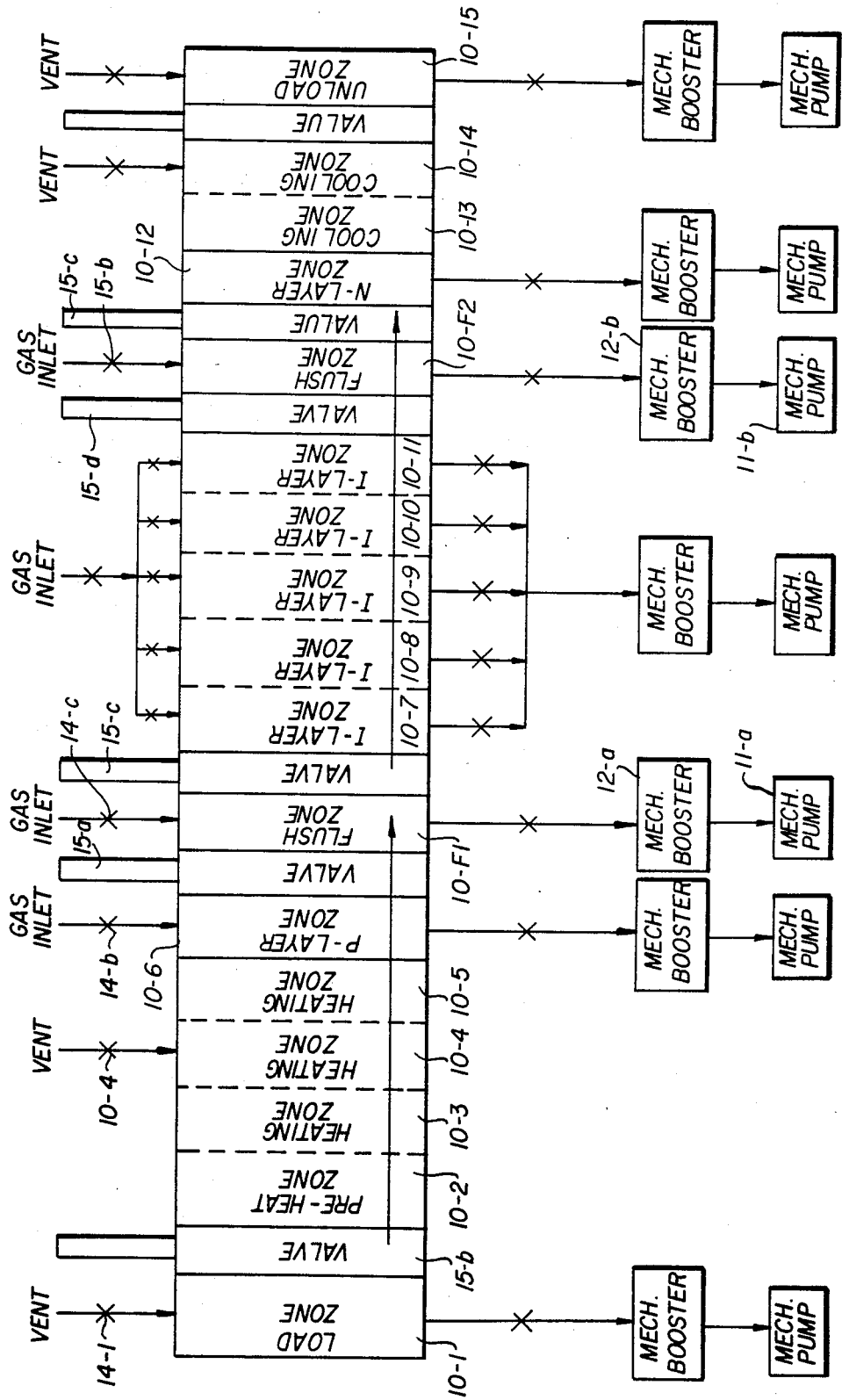
FIG. 5B is a schematic diagram of the system of FIG. 4 adapted for valve interlock isolation in accordance with the invention.

A valve interlock arrangement for the practice of the invention is illustrated schematically in FIG. 5B. The arrangement of the box carriers and the zones is the same as for FIG. 5A except that the "p" layer zone 10-6 is separated from the first of the "i" layer zones 10-7 by a flush zone 10-F1. Similarly, the last of the "i" layer zones is separated from the "n" layer zone 10-12 by a second flush zone 10-F2.

The first flush zone 10-F1 is positioned between respective valves 15-b and 15-c. Each of the valves 15-b and 15-c similar to the valve 15-a interposed between the initial load zone 10-1 and the first or pre-heat zone 10-2. In addition the flushing gas is applied through an inlet valve 14-a and drawn through the zone 10-F1 by a mechanical blower 12-a and a mechanical pump 11-a. A similar isolation of the i-layer zone 10-11 and the end layer zone 10-12 is made by the inclusion of a second flush zone 10-F2 between isolating valves 15-d and 15-e. The flow of the flush gas through a valve 15-b is controlled by a mechanical booster 12-b operating in conjunction with a mechanical pump 11-b.

A perspective view of an illustrative box carrier 10-n is shown in FIG. 6. The carrier 10-n includes an internal centrally disposed electrode 10-a, which may be either an anode or a cathode, that is disposed between opposite substrates 10-b and 10-c. The side walls of the carrier 10-n consitute a pair of similar electrodes 10-d and 10-e. When the central electrode 10-a is an anode, the side electrodes 10-d and 10-e are cathodes. Each of the side electrodes 10-d and 10-e is accompanied a substrate 10-f and 10-g. To energize the central electrode 10-a a conductive bar 16-1 is positioned above the carrier 10-n to make rolling or sliding contact with a terminal 16-2 of a suitable source 16-3. In the particular case of FIG. 6 the central electrode 10-a is an anode and the source 16-3 is grounded at 16-4. The region between the substrate 10-3 and 10-f includes a silent electric discharge, as does the similar region between the substrate 10-b and 10-g. An incoming gaseous mixture enters the carrier 10-n through slots 17-a and 17-b in the top surface 17-1 of the carrier. The gaseous mixture leaves the box, after having passed through the respective silent electric discharge regions by way of output slots 17-c and 17-d in the bottom member 17-2 of the carrier. Movement of the carrier 10-n through the various chambers is facilitated, for example, by the inclusion of rollers, of which only the roller 17-3 is visible in FIG. 6.

Figure 7A:
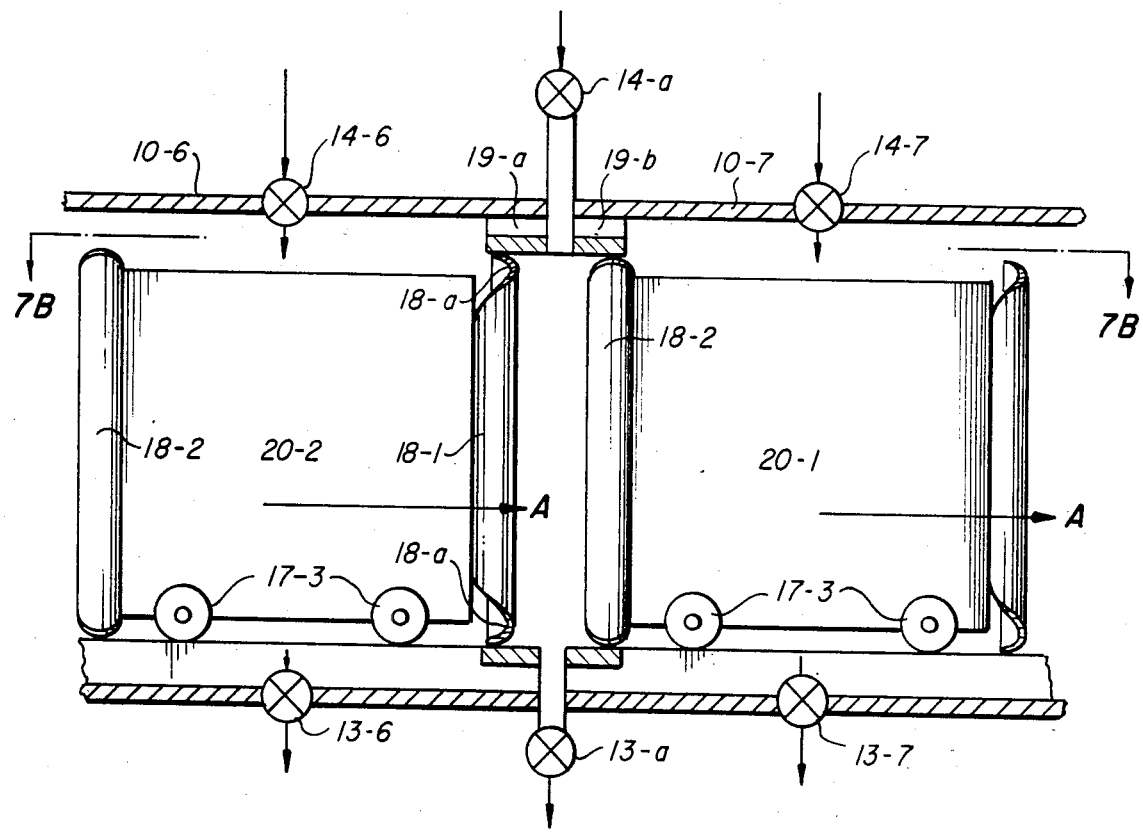
FIG. 7A is an elevation view of box carriers fitted with spring seals for the valveless or "gas curtain" system of FIG. 5A.

One technique for sealing the various chambers from one another, for example the chamber 10-6 from the next succeeding chamber 10-7 in FIG. 7A is by the inclusion of seals 18-1 and 18-2 with each by carrier. In the particular example of FIG. 7A the chamber 10-6 is shown with a second box carrier 20-2 following a predecessor carrier 20-1 in the succeeding chamber 10-7. The movement of the carriers through the chambers is in the direction indicated by the arrow A. The spring 18-1 is on the front surface of each carrier and a complementary sealing spring 18-2 is on the trailing surface of each carrier. As the leading portion of a carrier, for example the carrier 20-2, reaches the end of the chamber, the seal 18-1 with its flexible ends 18-a engages a counterseal 19-a which extends inwardly from the wall of the chamber 10-6. Similarly, when the carrier is centrally positioned in one of its chamber, e.g. chamber 10-7, the rear seal 18-2 engages the counterpart seal 19-b shown projecting inwardly from the associated chamber. The rollers 17-3 associated with the carriers are positioned to facilitate through movement of the carriers in the successive zones or chambers of the system.

Figure 7B:
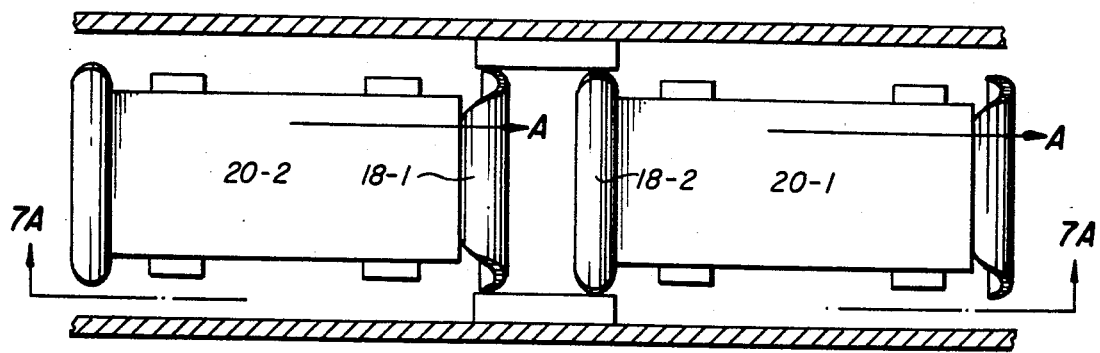
FIG. 7B is a plan view of the spring seal arrangement for the valveless or "gas curtain" system of FIG. 7A.

As noted earlier the successive carriers may be coupled to one another in standard fashion (not shown in FIGS. 7A and 7B). Since each of the box carriers, for example 20-1 and 20-2, is in the form of a rectangular cross section with its major axis vertical, a top sectional view as indicated in FIG. 7B requires corresponding modification in the dimensions of the respective leading and trailing seals 18-1 and 18-2.

While various aspects of the invention have been set forth by the drawings and specification, it is to be understood that the foregoing detailed description is for illustration only and that various changes in parts, as well as the substitution of equivalent constituents for those shown and described may be made without departing from the spirit and scope of the invention as set forth in the appended claims.

What is claimed is:

1. A box carrier for the deposit of materials, comprising
   a plurality of side walls which have a region of separation,
   a plurality of end walls joining said side walls,
   a substrate positioned in said carrier against one of said side walls,
   means for introducing a gaseous mixture into said region to permit a deposit therefrom on said substrate, and
   means for exhausting said gaseous mixture from said region.

2. A carrier in accordance with claim 1 wherein a vertically positioned electrode is included in said region and said side walls form an equipotential shell with respect to said electrode.

3. A carrier in accordance with claim 1 wherein said side walls are planar and parallel, and a subsrate is positioned at each side wall to receive deposits from said gaseous mixture.

4. A carrier in accordance with claim 2 wherein said electrode has opposed planar surfaces parallel to said side walls with substrates thereagainst for receiving deposits from said gaseous mixture.

5. A carrier in accordance with claim 1 wherein said gaseous mixture includes at least one silane and/or germane and said deposit is amorphous silicon and/or amorphous germanium.

6. A carrier in accordance with claim 1 wherein said chamber is quadrilateral with opposed parallel sides.

7. A carrier in accordance with claim 2 wherein said electrode acts as a bisector of said carrier.

8. A carrier in accordance with claim 7 wherein the bisected carrier has separate inlets and outlets for said gaseous mixture.

9. A carrier in accordance with claim 1 which is mobile to permit movement through a succession of different chambers.

10. The method of depositing material on substrates which comprises the steps of
    (a) providing a box carrier which contains at least one of said substrates; and
    (b) moving said carrier to a plurality of successive positions where a prescribed gas mixture is introduced into said chamber.

11. The method of claim 10 further including the provision of an electrode in said carrier and the electrical energization of said electrode at selected ones of said positions.

12. The method of claim 10 further including the preheating of said carrier at selected ones of said positions.

13. The method of claim 10 further including the cooling of said carrier at selected ones of said positions.

14. The method of claim 10 wherein a plurality of mobile carriers are provided and are isolated from one another by gas curtains between said positions; thereby to limit cross contamination of the substrate in said carrier because of different gas mixtures being introduced at different ones of said positions.

15. The method of claim 10 wherein a plurality of mobile carriers are provided and are isolated from one another by valve interlocks between said positions; thereby to limit cross contamination of the substrate in said carrier because of different gas mixtures being introduced at different ones of said positions.

16. The method of claim 15 further including a flush zone between adjoining valve interlocks.

17. The method of claim 14 further including a flush zone between said positions.

18. The method of claim 17 further including a baffle between said positions.

19. The method of claim 18 further including spring seals for engaging said baffle.

20. The method of claim 19 wherein said spring seals are on said carriers.

* * * * *